Aug. 30, 1966 W. J. CLIFFORD 3,270,211

BINARY-CODED DECADE COUNTER

Filed Oct. 5, 1962 2 Sheets-Sheet 1

*INVENTOR.*
WILLIAM J. CLIFFORD

*BY* E.A. Pettis
ATTORNEY

INVENTOR.
WILLIAM J. CLIFFORD
BY E. A. Petto
ATTORNEY

United States Patent Office 3,270,211

Patented August 30, 1966

3,270,211

BINARY-CODED DECADE COUNTER

William J. Clifford, Middletown, N.J., assignor to Electronic Associates Inc., Long Branch, N.J., a corporation of New Jersey Filed Oct. 5, 1962, Ser. No. 228,560
8 Claims. (Cl. 307—88.5)

This invention relates generally to binary-coded counting devices and, more particularly, to a high-speed binary-coded decade counter, which is self-programming.

It is well known to assemble groups of coded binary counters so as to conveniently represent a decimal number by the state of a given number of flip-flops or the like. Such groups of counters are usually operated in conjunction with suitable decoding or transfer units which sense the conditions of the flip-flops and route input pulses to change only the proper flip-flop for any single input pulse. The input pulses are usually applied to a ring counter or shift register which is under the control of the transfer unit for determining their application to the flip-flops. Yet other coded binary counters utilize storage units, which may also take the form of flip-flops for purposes of storing the count or conditions of the counting flip-flops.

Thus, coded binary counters, as known in the art, not only tend to provide a duplicity of counting logic in the form of flip-flops, which contribute significantly to the overall cost of the counters, but in addition provide for inherent counting delays because of the time involved for the input pulses to affect the condition of the various flip-flops.

Accordingly, an object of this invention is to provide a coded binary counter which largely eliminates the above-mentioned counting delay.

Another object of this invention is to provide a binary-coded decade counter including a plurality of gating circuits wherein pulses to be counted are applied successively to the individual stages of the counter so that the delay in switching of any stage is independent of the delay in switching of all others.

A further object of the invention is to provide a binary-coded decade counter wherein the conversion from binary to decade counting is made possible solely by the conditioning of the stages of the counting elements.

Another object of this invention is to provide a counter which is readily adapted for use as a ring, binary, or binary-coded decade counter.

According to a preferred form of the invention, the present counter comprises a plurality of bistable devices, each of which includes a pair of transistors which are triggerable to a particular state of conduction upon application of a trigger pulse to the base of one transistor of the pair. Each of the bistable devices has a first capacitor connected between the base of one transistor of the pair and the collector of the other transistor of the same pair, and a second capacitor connected between the base of the one transistor of the pair and the collector of a corresponding other transistor in the next succeeding bistable device. Circuit means are provided for connecting the collector of the other transistor of each pair to one side of the first capacitor of the next succeeding bistable device. Means including a source of biasing potential conditions one of the first capacitors to be responsive to trigger pulses which are delivered to the bistable devices along a serial chain of similarly-poled diode elements which form a serial logical "and" gate and which have a corresponding connection to each of the first capacitors. Trigger pulses applied to the chain of diodes successively trigger the bistable devices one at a time and produce a signal at each bistable device upon being triggered which may be used for purposes of resetting a previous stage.

These and other objects, features and advantages will be better understood from the following description taken in connection with the accompanying drawings, wherein.

Figure 1:
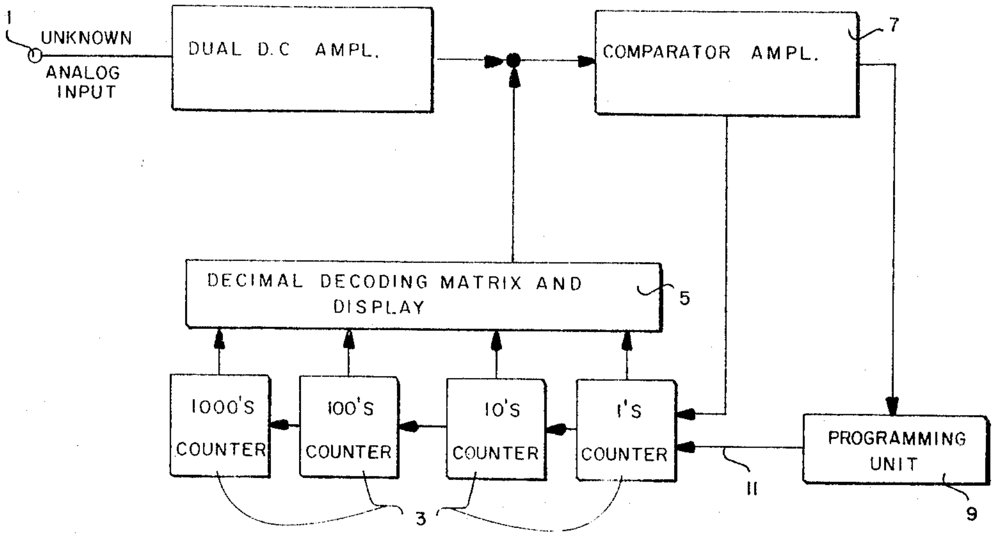
FIG. 1 is a block diagram of a circuit which may utilize a binary-coded decade counter according to the present invention.

The counter according to the present invention will be described generally in conjunction with FIG. 1 which shows one form of a conventional digital voltmeter in block form. Analog signals to be measured and displayed are applied to a terminal 1 and therefrom to a dual D.C. amplifier which may perform the function of phase inversion and may provide isolation between the digital voltmeter and the signal source. Four groups of counters according to the present invention are shown at 3 and are labeled 1000's, 100's, 10's and 1's. As is well known, each counter generates a decimal count which corresponds to a single digit in a decimal number corresponding to the amplitude of the unknown input signal. The condition of the counters 3 is sensed at a suitable decimal decoding matrix and display unit 5 which generates output signals which correspond to the amplitude of signal represented by the condition of the counters. A signal output is obtained from matrix 5 for comparison with the output from the dual D.C. amplifier. This comparison of signals is obtained at comparator amplifier 7 which provides output signals of agreement or disagreement between its input signals. The signals of agreement or disagreement are applied directly to the counters according to the present invention for conditioning the various stages thereof and to a programming unit 9. Programming unit 9 normally includes a suitable clock or trigger source, circuits for initiating and terminating operation, circuits for resetting the counters, and circuits for sensing the polarity of the input signals, as is well known. The trigger source is considered connected directly to the counters 3 via the line 11.

Figure 2:
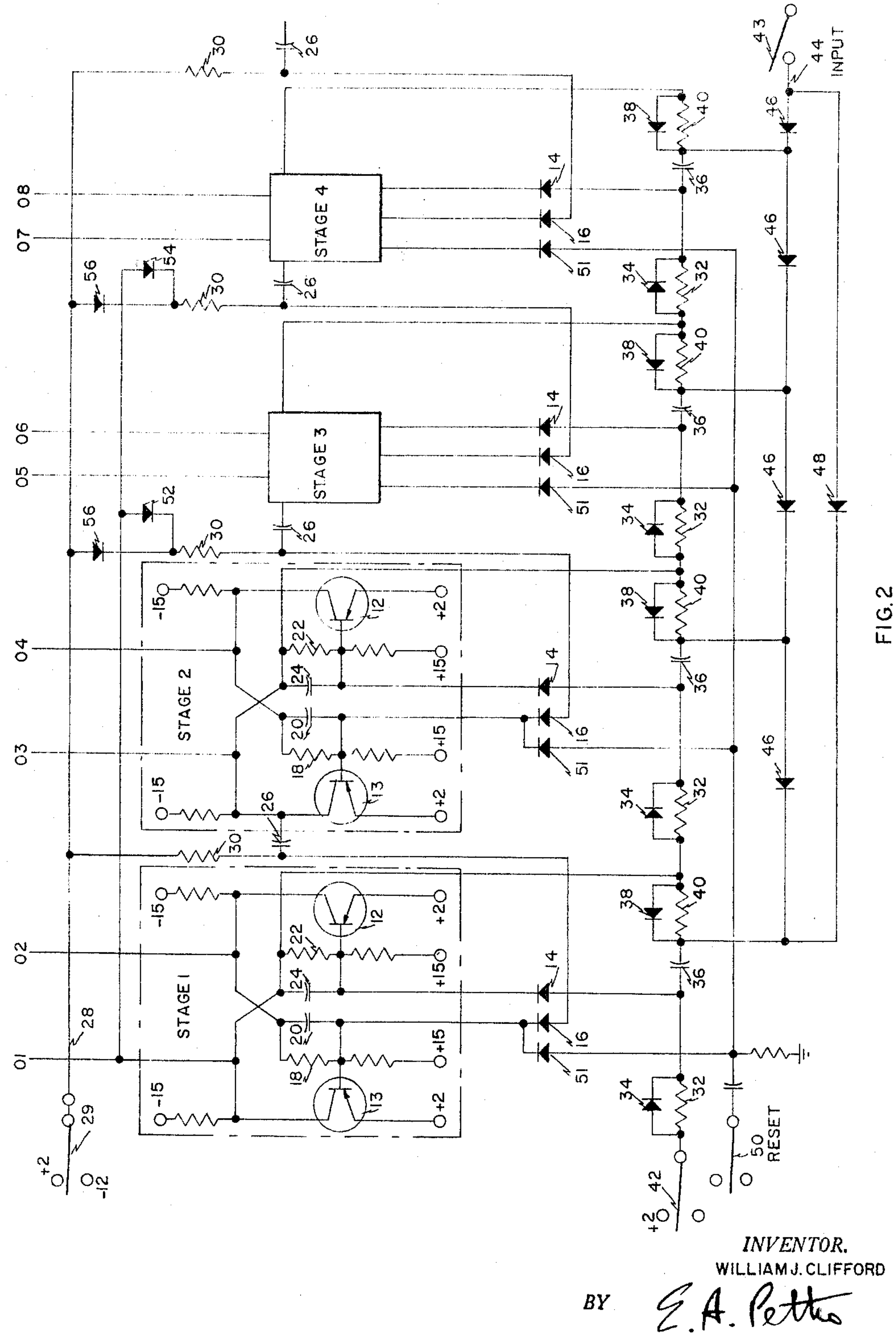
FIG. 2 is a circuit diagram of a binary-coded decade counter according to the present invention.

Turning now to FIG. 2, there is shown a single counter 3, which for purposes of illustration is presumed to correspond to the 1000's counter of FIG. 1. The counter of FIG. 2 is shown to comprise 4 stages, and each stage comprises a bistable multivibrator or flip-flop circuit which is entirely conventional in design. The first flip-flop stage, which is identical to the remaining flip-flop stages, is shown to comprise a pair of PNP transistors 12 and 13. A first input is coupled to the base of transistor 12 via is diode 14, and a second input is coupled to the base of transistor 13 via a diode 16. An output may be obtained at the collector of transistor 13, or, if output signals of opposite polarity are required, an output may be obtained at the collector of transistor 12. The collectors of both transistors in each stage are presumed to be connected directly to the matrix 5 in FIG. 1, as is well known. Although any suitable well known code may be used by the present counter, it is presumed that the stages from left-to-right are weighted according to the well-known BCD code of 8–4–2–1. Accordingly, stage 1 corresponds to a weight of 8000, stage 2 corresponds to a weight of 4000, stage 3 corresponds to a weight of 2000, and stage 4 corresponds to a weight of 1000.

If a positive going clock or trigger pulse is applied to the base of transistor 12 when transistor 12 is conductive, transistor 12 is rendered non-conductive and the resultant negative potential swing of its collector is coupled to the base of transistor 13 via resistor 18 and capacitor 20 to render transistor 13 conductive. The resulting positive potential which appears at the collector of conducting transistor 13 is coupled to the base of transistor 12 via resistor 22 to hold transistor 12 non-conductive. Similarly, if a positive-going pulse is applied to the base of transistor 13 via the diode 16 when transistor 13 is conductive, transistor 13 is rendered non-conductive and transistor 12 is rendered conductive by the negative collector potential swing coupled to its base via resistor 22 and capacitor 24. When transistor 13 is rendered non-conductive, the negative potential at its collector is coupled to the base of transistor 12 via the resistor 22 to hold the transistor 12 conductive. Similarly, the positive potential at the collector of conductive transistor 12 is coupled to the base of transistor 13 via the resistor 18 to hold transistor 13 non-conductive.

The second input of each stage of the counter is obtained via a diode 16 which is coupled to the collector of the left-hand transistor 13 of the next succeeding stage of the counter by a capacitor 26. The juncture of each dioded 16 and capacitor 26 is connected to a line 28 by a resistor 30. In FIG. 2, for purposes of illustration, the line 28 is shown to be connected to a switch 29 which applies either +2 volts or −12 volts to the line. In the circuit of FIG. 1, the line 28 and switch 29 may correspond to the comparator 7 in FIG. 1, and the signal of +2 volts may correspond to a condition where the count generated by the counter is greater than the amplitude of the input signal and the signal of −12 volts may correspond to a condition where the count generated by the counter is less than the amplitude of the input signal.

Each stage also includes a first speed-up or clamping network, comprising a resistor 32 connecting in slunt to a diode 34, which is connecting in series with a coupling capacitor 36. Diode 14 has a direct connection to the juncture of a corresponding capacitor 36 and this speed-up network. The capacitor is in turn connected in series with a second speed-up or clamping network comprising a parallel circuit arrangement of a diode 38 and a resistor 40. The second speed-up network for each stage is connected in series with the first speed-up network for the next succeeding stage, and the juncture of these speed-up networks is connected directly to the collector of the transistor 13 which corresponds to the second network. The diodes 34 and 38 for each stage are oppositely poled relative to the corresponding capacitor 36 and serve to provide a positive potential clamp for biasing potentials, as will be hereinafter described.

When the present counter is first placed into operation, a switch 42, which may also be disposed within the programming unit 9, is depressed in order to apply a +2 volt bias to the base of transistor 13 of stage 1. After the occurrence of the first input pulse switch 42 may be opened and the count at the flip-flops may progress automatically. Switch 42 may be suitably ganged for operation with a "start switch" 43 also located within the programming unit 9.

The input pulses to the present counter are delivered from the trigger or clock source within the programming unit 9 via the switch 43 and applied along a line 44 which include a plurality of diodes 46 connected in the form of an "and" gate. Each of the diodes 46 corresponds to a particular counting stage and the output side or cathode of each diode is connected to the juncture of its corresponding capacitor 36 and second speed-up network. A diode 48 is shown to be connected in shunt to the diodes 46 for a purpose hereinafter made apparent.

When the counter is being readied for operation, a reset key 50, also disposed within the programming unit 9, may be momentarily depressed to simultaneously apply a potential swing of +12 volts to the base of each of the transistors 13 via corresponding diodes 51. All stages are thereby triggered to a condition where each of the transistors 13 are non-conductive and each of the transistors 12 are conductive. In this reset or quiescent condition, the right-hand side of each capacitor 36 is maintained at the collector potential of its corresponding non-conductive transistor 13 via a current path through the corresponding resistor 40. The left-hand side of this same capacitor is maintained at the collector potential of the non-conducting transistor 13 in the preceding stage via a current path through its corresponding diode 34 and resistor 32. Thus, each diode 14 is back-biased by the application of this −12 volt potential to its anode. Similarly, each diode 46 is forward biased by a −12 volt potential at its cathode. Initially the diodes 16 are each back-biased by a −12 volt potential on the line 28.

Figure 3:
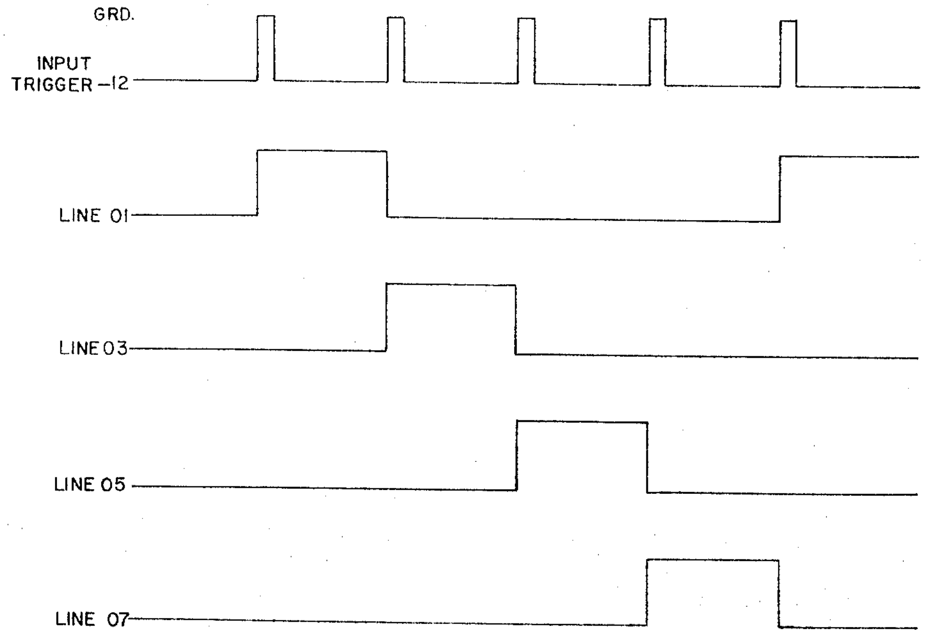
FIG. 3 is a diagram of input pulses for controlling the counter of FIG. 2, and of output pulses produced by the counter of FIG. 2.

When switch 42 is depressed, a +2 volt potential is applied via the stage 1 diode 34 to the left-hand side of capacitor 36 and to the anode of diode 14 of stage 1. While this +2 volt potential persists, diode 14 of stage 1 is forward biased; this +2 volt potential is, however, of insufficient amplitude to trigger stage 1 transistor 12 to a non-conductive state. An input pulse may now be applied to the line 44, and in the present embodiment as shown in FIG. 3, the input pulses may be considered positive-going and may rise from a potential of −12 volts to 0 volt. The first input pulse is passed by each of the diodes 46 and is applied simultaneously to the right-hand side of each of the capacitors 36. In the case of stages 2 through 4, since the left-hand side of each capacitor 36 is at −12 volt, the resultant potential swing at the diodes 14 is of insufficient amplitude to produce any change in the conductive state of corresponding transistors 12. In the case of stage 1, however, this positive swing of 12 volts, when added to the +2 volts already existing at the anode of diode 14, is of sufficient amplitude to trigger transistor 12 to a non-conductive state. Stage 1 transistor 13 is triggered to a conductive state when transistor 12 becomes non-conductive and accordingly, the output line O1, which is connected to the collector of transistor 13, rises to +2 volts. This +2 collector potential is also applied to the cathode of the diode 46 which corresponds to stage 1 via the diode 38 and to the left-hand side of capacitor 36 which corresponds to stage 2 via the corresponding speed-up or clamping network.

The diode 46 which corresponds to stage 1 is accordingly back-biased and subsequent input pulses are prevented from thereafter directly affecting the condition of this stage. With +2 volts applied to the left-hand side of capacitor 36 and to the anode of diode 14 in stage 2, this stage is in readiness to be triggered by the next input pulse. This next input pulse not only triggers stage 2 but may also serve to reset stage 1. If line 28 happens to be at the +2 volt potential, stage 1 is reset by the positive-going swing of potential which occurs at the collector of transistor 13 of stage 2 when it is triggered to a conductive state. This positive potential swing of approximately 14 volts is coupled to the base of transistor 13 in stage 1 via the capacitor 26 which interconnects the collector of transistor 13 in stage 2 and diode 16 in stage 1. If, on the other hand, line 28 remains at −12 volts when transistor 13 of stage 2 is triggered to a conductive state, indicating that the count of 8000 is smaller than the input signal, the positive potential swing at the collector of this transistor is of insufficient amplitude to reset stage 1. Should transistor 13 of stage 1 be triggered to a non-conductive state, it will be noted that the back-bias is removed from the corresponding diode 46. The next subsequent input pulse will not, however, affect this stage since the diode 46 in stage 2 is now back-biased by the +2 volt collector potential of its transistor 13 and prevents this trigger pulse from affecting stage 2 or any preceding stages in the chain.

In this regard, it is to be noted that the +2 volt potential passed by the diode 46 which corresponds to stage 2 is applied to and passed by the diode 46 which corresponds to stage 1 in order to apply a back-biasing potential to the diode 48 and thus prevent input pulses from thereafter affecting the condition of stage via a path along the diode 48. Thus, irrespective of whether a stage is reset or permitted to remain in a set state, a subsequent input pulse will not affect its state because of the blocking action of the diodes 46 and 38. When the diode 46 in the 4th stage is back-biased by a positive potential swing at corresponding transistor 13 in response to the 4th input pulse, the counter shown will cease to count. The 4th stage may, however, be reset upon subsequent triggering of the 1st stage in the 100's counter 3 if the output line 28 from comparator 7 is at +2 volts. The reset signal is applied to the 4th stage from the first stage of the next lower order counter via the corresponding diode 16. FIG. 3 illustrates input and output pulses which correspond to the condition where all 4 stages of the counter of FIG. 2 are reset after 5 input pulses.

When the present counter is extended, as in the example of FIG. 1, by additional groups of counters of four stages each, a diode 48 is connected in shunt to each successive 4 stage group of diodes 46 to provide a convenient path by which the trigger signals traverse the stages from right to left. A trigger pulse applied to the line 11 in FIG. 1 may readily by-pass the 3 right-hand counters 3 and thereby 3 groups of 4 diodes 46 via the corresponding shunt diodes 48. Degradation of the amplitude of the trigger pulse is thereby prevented by a factor of 4 to 1. Although the diode 48 is shown to be connected in shunt to only 4 diodes 46, more or less diodes 46 may be shunted by a given diode 48. The only requirement for satisfactory operation is that the cathode of a given diode 48 be maintained more positive than the peak-positive amplitude of the trigger pulse.

As should be apparent, the counter of FIG. 2 is capable of generating a decimal count from 0 to 16665 in response to the applied input trigger signals, viz., each counter stage is capable of counting to 15. Although it is quite acceptable to permit the highest order counter of a digital voltmeter to count to 15, it is desirable that the lower order counters be limited to a count of 9. The use of the diodes 52 and 54 in FIG. 2, each of which has its anode connected to the collector of transistor 13 in stage 1, achieves this end. Diode 52 is shown to be connected to stage 3 resistor 30 at its juncture to the line 28 while diode 54 is shown to be connected to stage 4 resistor 30 at its juncture to the line 28. With this arrangement of diodes, stages 2 and 3 must be triggered to a reset condition whenever the transistor 13 in stage 1 is retained in a conductive state. The diode 52 and its corresponding diode 56 and the diode 54 and its corresponding diode 56 form logical "or" gates for the stages 2 and 3. Thus, if line 28 is at +2 volts or the collector of transistor 13 in stage 1 remains at +2 volts, stages 2 and 3 will be reset.

The counter of FIG. 1 is also readily adapted for use as a ring counter merely by connecting the stages in an endless chain. To this end, the capacitor 26 in stage 4 is coupled directly to the collector of transistor 13 in stage 1 and the collector of transistor 13 in stage 4 is connected directly to the first clamping network at stage 1. This latter connection is conveniently made via the switch 42, which may be normally closed and adapted for momentary closure on the +2 volt source in this example. The diode 38 of the 4th stage is preferably eliminated when the counter is adapted for use as a ring counter so that the positive bias clamp is removed from diode 48 when the transistor 13 in stage 4 is triggered to a conductive state. Diode 48 provides a path for trigger pulses to stage 1 when transistor 13 in stage 4 is triggered to a conductive state and permits for the usual ring counter operation. The line 28 would be permanently biased at +2 volts when the present counter is connected for operation as a ring counter.

Although the circuit of the present counter has been described as comprising PNP transistors and positive-going trigger pulses, it will be understood that NPN transistors could be used in the exact same circuits by the reversal of the biasing potenials, the various diodes and the polarity of the trigger pulses. Similarly, although specific amplitudes of potential have been herein referred to for purposes of illustration, it will be understood that such use of voltage amplitudes was merely exemplary and not in a limiting sense.

While the present invention has been described by reference to a particular embodiment thereof, it will be understood that numerous modifications may be made by those skilled in the art without actually departing from the scope thereof as set forth in the appended claims.

I claim:

1. A counter comprising a plurality of bistable devices, each including a pair of transistors which are triggerable to a particular condition of conduction upon application of a trigger pulse to one transistor of the pair, first means coupling one transistor of a pair to the other transistor of the same pair and to said one transistor in the next succeeding bistable device, second means coupling said other transistor of each bistable device to said other transistor in the next succeeding bistable device, means applying an enabling potential of predetermined polarity and amplitude to one of said first coupling means, and means including an individual diode for each of said bistable devices with said diodes being connected in endless chain. To this end, the capacitor 26 in stage 4 series circuit relation and with a connection between each of said bistable devices and its respective diode for controlling the application of electrical trigger pulses to be counted by said bistable devices, one end of said series circuit of diodes being connected to a trigger pulse source whereby said plurality of bistable devices are successively triggered in response to successive trigger pulses and each of said diodes are rendered ineffective for applying further trigger pulses to a corresponding bistable device upon said bistable device having been once triggered.

2. A counter according to claim 1 wherein an additional diode is connected in shunt to said diodes connected in a serial chain.

3. A counter comprising a plurality of bistable devices, each including a pair of transistors which are triggerable to a particular state of conduction upon application of a trigger pulse to one transistor of the pair, first means coupling one transistor of a pair to the other transistor of that pair and to the one transistor in the next succeeding bistable device, second means coupling said other transistor of each bistable device to the said other transistor of the next succeeding bistable device, means applying an enabling potential of predetermined polarity and amplitude to one of said first coupling means, and diode means corresponding to each of said bistable devices for controlling the application of electric trigger pulses to be counted by said bistable devices, each of said diode means being similarly poled and connected in a serial chain and to a trigger pulse source, each of said diode means having a connection to said corresponding first coupling means whereby said plurality of bistable devices are successively triggerable in response to successive trigger pulses and whereby each of said diode means are successivly disabled from applying further trigger pulses to a corresponding bistable device upon said corresponding bistable device having been once triggered.

4. A counter comprising a plurality of bistable devices, each including a pair of transistors which are triggerable to a particular state of conduction upon application of a trigger pulse to one transistor of the pair, means including a pair of diode elements coupling one transistor of a pair to the other transistor of that pair and to the one transistor in the next succeeding bistable device, means including a capacitor coupling said other transistor of each bistable device to the said other transistor of the next succeeding bistable device, means applying an enabling potential of predetermined polarity and amplitude to one of said means including a pair of diode elements, and diode means corresponding to each of said bistable devices for controlling the application of electric trigger pulses to be counted by said bistable devices, each of said diode means being similarly poled and connected in a serial chain and to a trigger pulse source, each of said diode means having a connection to one of the pair of diode elements of said corresponding first coupling means whereby said plurality of bistable devices are successively triggerable in response to successive trigger pulses and whereby each of said diode means are successively disabled from applying further trigger pulses to a corresponding bistable device upon said corresponding bistable device having been once triggered.

5. A counter according to claim 4 wherein a capacitor couples said one of the pair of diode elements to the said other transistor of the pair and the corresponding said diode means is connected to the juncture of said capacitor and said one diode element of the pair.

6. A counter comprising a plurality of bistable devices a source of trigger pulses, each including a pair of transistors having a base, collector and emitter which are triggerable to a particular state of conduction upon application of a trigger pulse from said trigger pulses source to one transistor of the pair, means including a pair of similarly poled diode elements coupling the collector of one transistor of a pair to the base of the other transistor of the pair and to the base of the corresponding other transistor in the next succeeding bistable device, means including a capacitor coupling the base of said one transistor of each bistable device to the collector of said one transistor in the next succeeding bistable device, means for applying an enabling potential of predetermined amplitude and polarity to a selected one of said pair of diode elements coupling a collector of a said one transistor to the base of a said other transistor in the next succeeding bistable device, and a diode means connected to said trigger pulse source corresponding to each of said bistable devices and having a connection to a corresponding other of each said pair of diode elements for controlling the application of trigger pulses to said bistable devices.

7. A counter according to claim 6 wherein a capacitor element is disposed between said other of each said pair of diode elements and the base of said corresponding other transistor and said corresponding diode means is connected to the juncture of said last-named capacitor and diode element.

8. A counter according to claim 7 wherein another source of enabling potential is connected to said coupling capacitors whereby resetting pulses are applied selectively from the collector of one said transistor to the base of one said transistor in the preceding bistable device.

References Cited by the Examiner

UNITED STATES PATENTS

| | | | |
|---|---|---|---|
| 2,869,000 | 1/1959 | Bruce | 307—88.5 |
| 3,054,060 | 9/1962 | Thomason | 328—44 |

ARTHUR GAUSS, *Primary Examiner.*

S. D. MILLER, *Assistant Examiner.*